United States Patent
Lin et al.

[11] Patent Number: 6,066,874
[45] Date of Patent: May 23, 2000

[54] FLASH MEMORY CELL WITH VERTICAL CHANNELS, AND SOURCE/DRAIN BUS LINES

[75] Inventors: Chrong-Jung Lin, Hsin-Tein; Shui-Hung Chen, Hsin-Chu; Jong Chen, Taipei; Di-Son Kuo, Hsinchu, all of Taiwan

[73] Assignee: Taiwan Semiconductor Manufacturing Company, Hsin-Chu, Taiwan

[21] Appl. No.: 09/407,108

[22] Filed: Sep. 27, 1999

Related U.S. Application Data

[63] Continuation of application No. 08/995,999, Dec. 22, 1997, Pat. No. 6,011,288.

[51] Int. Cl.[7] .................................................. H01L 29/788
[52] U.S. Cl. ......................... 257/315; 257/316; 257/321
[58] Field of Search ............................. 257/315, 316, 257/317, 321

[56] References Cited

U.S. PATENT DOCUMENTS

| | | | |
|---|---|---|---|
| 5,451,538 | 9/1995 | Fitch et al. ................................. | 487/60 |
| 5,467,305 | 11/1995 | Bertin et al. ........................ | 365/185.01 |
| 5,495,441 | 2/1996 | Hong .................................... | 365/185.01 |
| 5,587,949 | 12/1996 | Bergemont et al. ............... | 365/185.24 |
| 5,595,927 | 1/1997 | Chen et al. ............................... | 437/52 |
| 5,751,038 | 5/1998 | Mukherjee ............................... | 257/316 |
| 6,002,151 | 12/1999 | Lin et al. ................................. | 257/316 |

*Primary Examiner*—Ngân V. Ngô
*Attorney, Agent, or Firm*—George O. Saile; Stephen B. Ackerman; Graham S. Jones

[57] ABSTRACT

A vertical memory device on a silicon semiconductor substrate comprises a floating gate trench in the substrate. in the array, the trench. The walls of the floating gate trench were doped with a threshold implant through the trench surfaces. There is a tunnel oxide layer on the trench surfaces, the tunnel oxide layer having outer surfaces. There is a floating gate electrode in the trench on the outer surfaces of the tunnel oxide layer. There are source/drain regions in the substrate self-aligned with the floating gate electrode. The source line and a drain line form above the source region and the drain region respectively. An interelectrode dielectric layer overlies the top surface of the floating gate electrode, and the source line and the drain line, and there is a control gate electrode over the interelectrode dielectric layer over the top surface of the floating gate electrode.

25 Claims, 8 Drawing Sheets

FLASH MEMORY CELL WITH VERTICAL CHANNELS, AND SOURCE/DRAIN BUS LINES

This application is a continuation of application Ser. No. 08/995,999 filed Dec. 22, 1997, now U.S. Pat. No. 6,011,288.

BACKGROUND OF THE INVENTION

1. Field of the Invention

This invention relates to semiconductor memory devices and more particularly to vertical channel flash memory devices.

2. Description of Related Art

To maintain enough current through the channel of a flash memory cell more area is required for a traditional ETOX (nonvolatile memory with a metal drain line that contacts each drain region in a column of drain regions) structure since the channel is parallel to the wafer surface.

During the programming and erasing procedure, the tunneling electron always needs to pass through part of the channel area which results in charge trapping and transconductance degradation.

See as follows:

U.S. Pat. No. 5,451,538 of Fitch et al. for "Method for Forming a Vertically Integrated Dynamic Memory Cell";

U.S. Pat. No. 5,467,305 of Bertin et al. for "Three-Dimensional Direct-Write EEPROM Arrays and Fabrication Methods";

U.S. Pat. No. 5,495,441 of Hong for "Split-Gate Flash Memory Cell";

U.S. Pat. No. 5,587,949 of Bergemont et al. for "Method for Programming an ETOX EPROM or Flash Memory When Cells of the Array are Formed to Store Multiple Bits of Data"; and U.S. Pat. No. 5,595,927 of Chen et al. for "Method for Making Self-Aligned Source/Drain Mask ROM Memory Cell Using Trench Etched Channel".

SUMMARY OF THE INVENTION

An increase in channel width is achieved by increasing diffusion depth.

Several advantages of this invention are as follows:

1. The unit cell can take less cell area but with more channel area.

2. Because the floating gate is under the wafer surface, the step height of the stacked control gate electrode is lower than that of traditional control gate electrode. The etch steps which follow, for example the etch to form the gate electrode stack and the etch to form the contact hole, becomes much easier.

3. The tunnel oxide which is used for erasing, is between source/drain and floating gate and not overlapped with channel. Therefore, the band-to-band hot hole phenomenon can be completely prevented during erasing procedure since the conventional P-N junction formed from source/drain with bulk is not involved in this cell structure.

4. Since the part of tunnel oxide layer used for erasing is not located at channel, the problem of reduced reliability caused by erasing can be avoided.

5. Because the area of the tunnel oxide layer between the source/drain regions and the floating gate is much larger thin that of the traditional structure, it can be expected that the erasing speed will be much faster also.

Advantages of this invention are as follows:

1. The cell structure of this invention uses vertical channel but not traditionally horizontal one.

2. The cell structure of this invention can be packed more dense for cell array since the channel is vertical to the wafer surface.

3. The step height of stacked gate structure is lowered down with the cell structure of this invention.

4. With the memory cell of this invention, during the erasing procedure, the band-to-band hot hot hole phenomena can be prevented completely.

In accordance with this invention, a vertical memory device comprises the following structure. A floating gate trench is formed in a semiconductor substrate, the trench having trench surfaces with a tunnel oxide layer on the trench surfaces, the tunnel oxide layer having outer surfaces. A floating gate electrode is formed in the trench on the outer surfaces of the tunnel oxide layer with source/drain regions in the substrate self-aligned with the floating gate electrode. A P/N junction isolation means provides a reverse bias of PN junctions in the device. An interelectrode dielectric layer is formed over the top surface of the floating gate electrode, and a control gate electrode is formed over the interelectrode dielectric layer over the top surface of the floating gate electrode.

Preferably, the trench has a depth from about 100 Å to about 20,000 Å; the tunnel oxide layer has a thickness from about 70 Å to about 200 Å, and the floating gate electrode has a thickness of from about 100 Å to about 3,000 Å; the threshold implant comprises boron which was implanted with a concentration of dopant from about $1\ E\ 12$ atoms/cm$^3$ to about $1\ E\ 14$ atoms/cm$^3$; source/drain regions were implanted with a dopant selected from the group consisting of arsenic and phosphorus with a concentration of from about $1\ E\ 14$ atoms/cm$^3$ to about $1\ E\ 16$ atoms/cm$^3$; a source line region is provided on the source side of the trench aligned with and adjacent to the source region, a drain line region is provided on the drain side of the trench aligned with and over the drain region.

In accordance with another aspect of this invention, a vertical memory device on a silicon semiconductor substrate comprises the following. A floating gate trench is formed in the silicon semiconductor substrate. The trench has trench surfaces, the trench having a depth from about 100 Å to about 20,000 Å. The walls of the floating gate trench are doped with a threshold implant through the trench surfaces. A tunnel oxide layer is formed on the trench surfaces, the tunnel oxide layer having outer surfaces, the tunnel oxide layer having a thickness from about 70 Å to about 200 Å. A floating gate electrode is formed in the trench on the outer surfaces of the tunnel oxide layer. The floating gate electrode comprises doped polysilicon with a thickness from about 1,000 Å to about 3,000 Å. The source/drain regions in the substrate are self-aligned with the floating gate electrode. The source/drain regions were implanted with a dopant selected from the group consisting of arsenic and phosphorus with a concentration of from about $1\ E\ 14$ atoms/cm$^3$ to about $1\ E\ 16$ atoms/cm$^3$. A source line region is provided on the source side of the trench aligned with and over the source region. A drain line region is provided on the drain side of the trench aligned with and over the drain region. An interelectrode dielectric layer overlies the top surface of the floating gate electrode and the source line and the drain line. A control gate electrode overlies the interelectrode dielectric layer over the top surface of the floating gate electrode.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
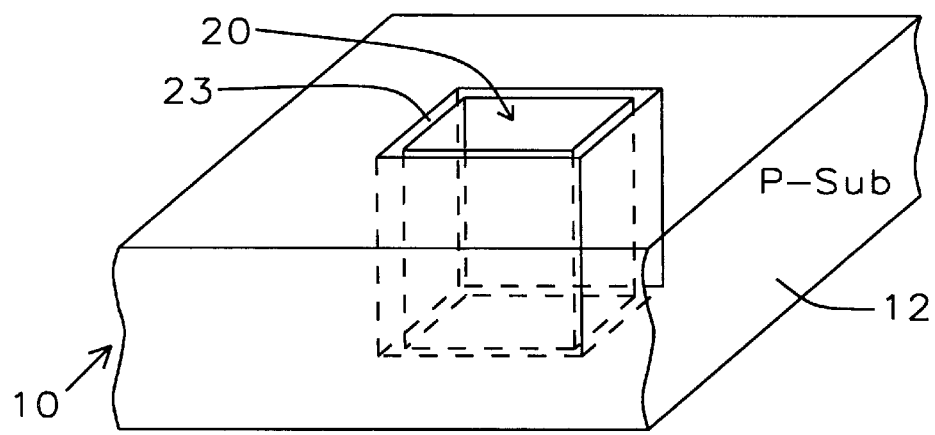
FIG. 1 shows a device in accordance with this invention in an early stage of manufacture.

FIG. 1 shows a perspective view of a device 10 in accordance with this invention in an early stage of manufacture. Device 10 includes a P-doped silicon semiconductor substrate 12 with a four sided cubic trench hole with four sidewalls and a bottom 20 formed therein by etching in accordance with an etching process selected from those which are well known to those skilled in the art. A tunnel (silicon oxide) oxide layer 23 has been formed on the four interior sidewalls and on the bottom of the cubic trench hole 20. four sided cubic trench hole 20 has a depth from about 1,000 Å to 2,000 Å. The tunnel oxide layer 23 has a thickness from about 70 Å to about 200 Å.

Figure 2:
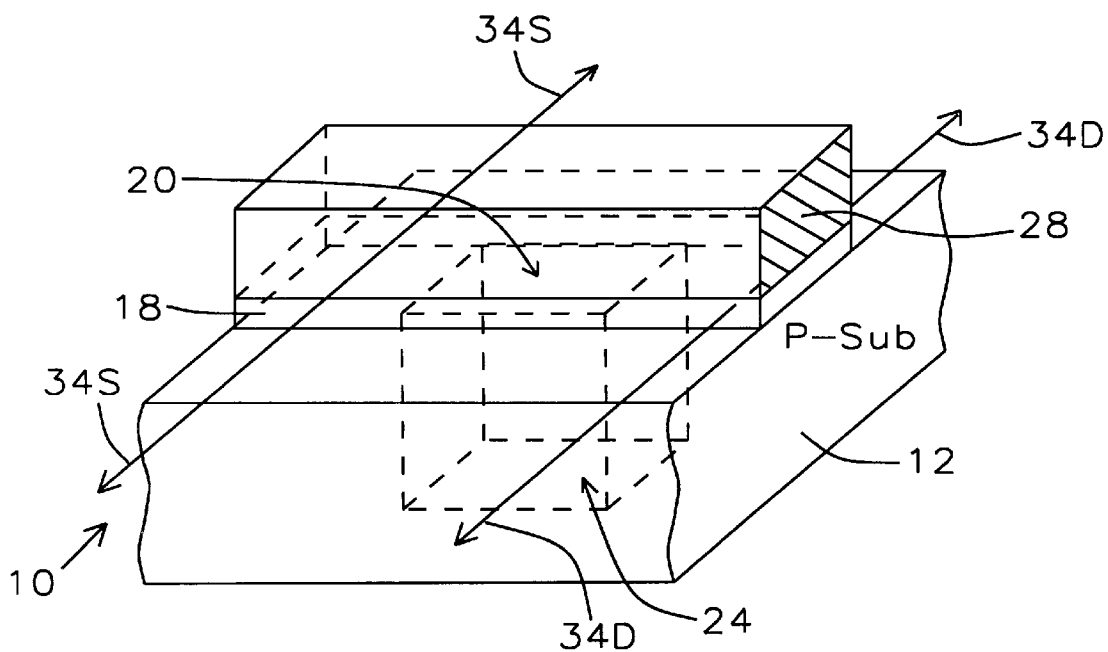
FIG. 2 shows a perspective view of the basic cell structure of the device of FIG. 1 after completion of the process of manufacture.
Figure 7:
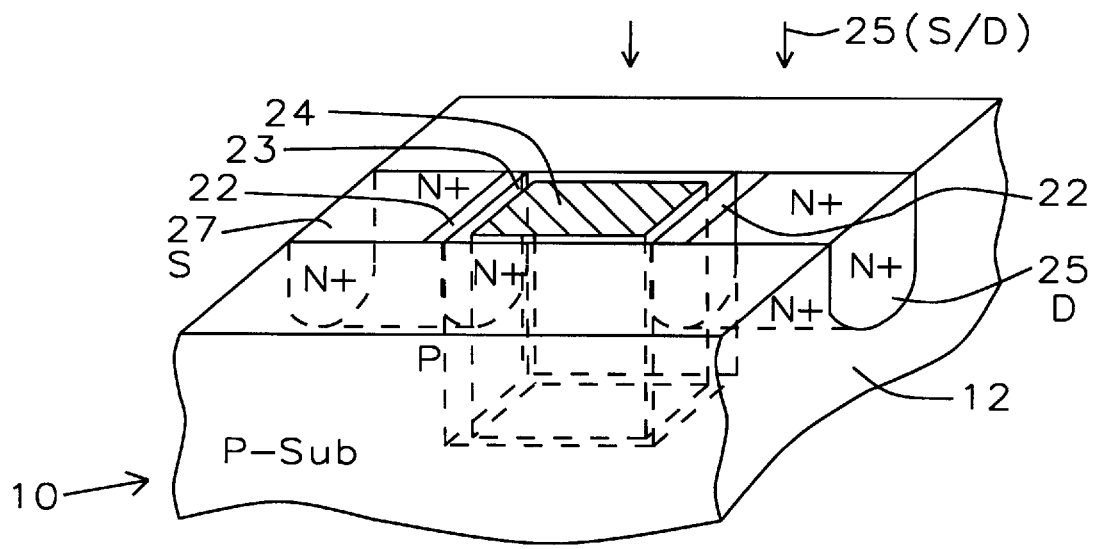
FIG. 7 shows a perspective view of the device of FIG. 6 after formation of the N+ doped source/drain regions in the substrate self-aligned with the floating gate electrode.

FIG. 2 shows a perspective view of the basic cell structure of the device 10 of FIG. 1 after completion of the process of manufacture. Inside the tunnel oxide layer 23, a 20 floating gate electrode 24 has been formed. The floating gate electrode 24 has a thickness of from about 300 Å to about 2,000 Å. Isolation oxide/interpolysilicon dielectric layers 18/26 have been formed over the surface of the floating gate electrode 24 and the substrate 12. Both a diffusion source line 34S and a diffusion drain line 34D (seen in greater detail in FIGS. 9–11) pass through the interpolysilicon dielectric layer 18 above source and drain regions (not shown) formed in the substrate 12 adjacent to the floating gate electrode, as can be seen in FIG. 7. The source line and the drain line can be connected in an alternative way without being formed above the source/drain regions 27/25 which are seen in FIGS. 7–11. Above the isolation oxide/interpolysilicon dielectric layers 18/26 are formed the control gate electrode 28 which is oriented at right angles to the diffusion source line 34S and the diffusion drain line 34D crossing over the floating gate electrode 24 in the four sided cubic trench hole 20 as well as the source and drain electrodes seen in FIG. 7.

Figure 3:
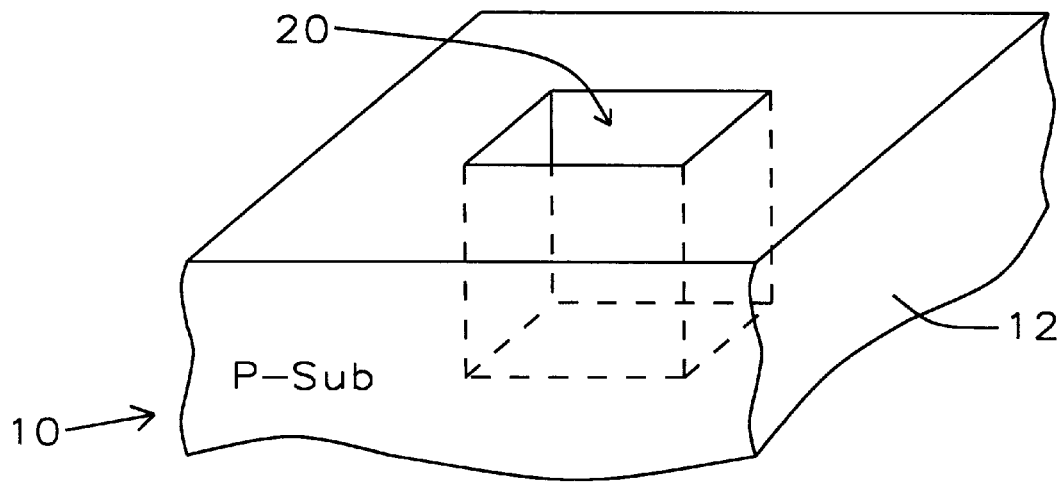
FIG. 3 shows a perspective view of the device of FIG. 1 in an early stage of manufacture where the trench hole has been provided in P-doped substrate.

FIG. 3 shows a perspective view of the device 10 of FIG. 1 in an early stage of manufacture where the trench hole 20 has been provided in P-doped substrate 12.

Figure 4:
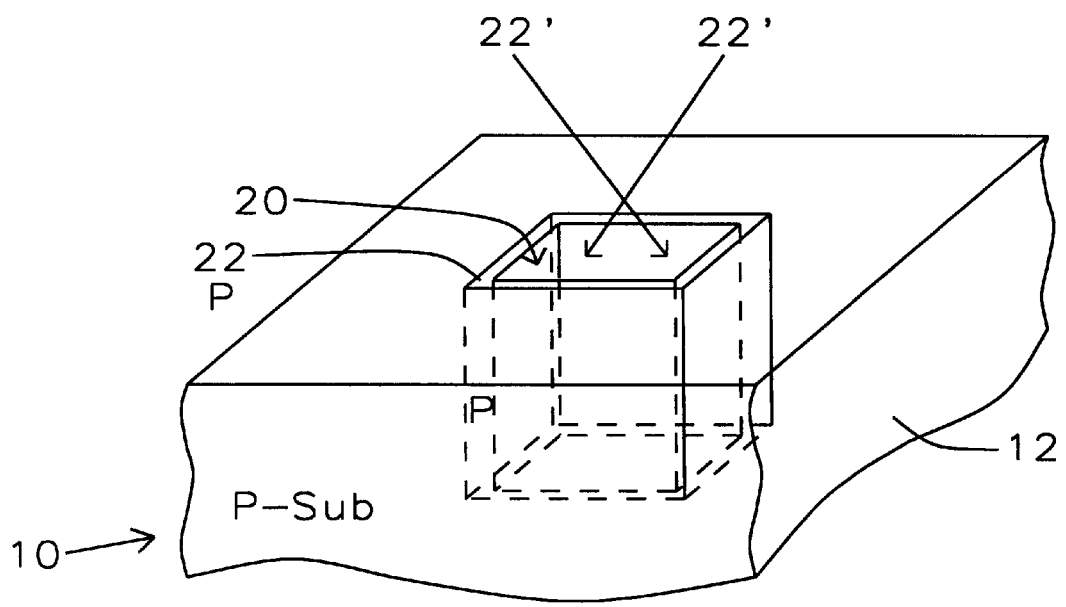
FIG. 4 shows a perspective view of the device of FIG. 3 during the process of a cell threshold voltage implant of P-type dopant into the walls and the bottom surfaces of the trench in the substrate.

FIG. 4 shows a perspective view of the device 10 of FIG. 3 during the process of a cell threshold voltage implant of P-type dopant into the four side walls 22 and the bottom surface of the cubic trench hole 20 in the substrate 12. The threshold implant was made by an ion implant with a dose of $BF_2$ (boron fluoride) P-type dopant from about 1 E 13 ions/cm$^2$ to about 5 E 13 ions/cm$^2$ at an energy from about 50 keV to about 250 keV. The walls 22 were doped with a concentration of P-type boron dopant from about 1 E 14 atoms/cm$^3$ to about 1 E 16 atoms/cm$^3$.

Figure 5:
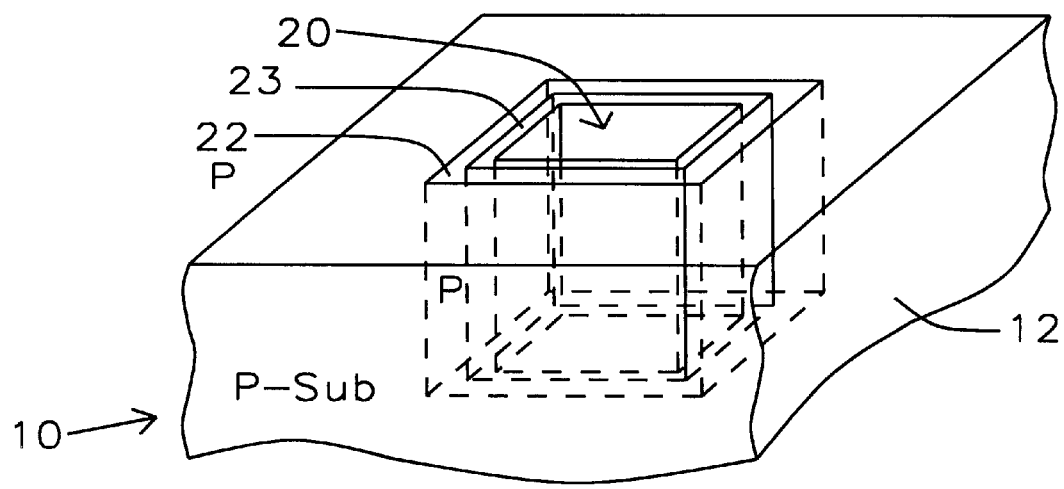
FIG. 5 shows a perspective view of the device of FIG. 4 after the process of growing a tunnel oxide layer on the interior surfaces of the trench.

FIG. 5 shows a perspective view of the device 10 of FIG. 4 after the process of growing a tunnel oxide (silicon oxide) layer 23 on the interior surfaces of trench 20 with a thickness from about 70 Å to about 200 Å.

Figure 6:
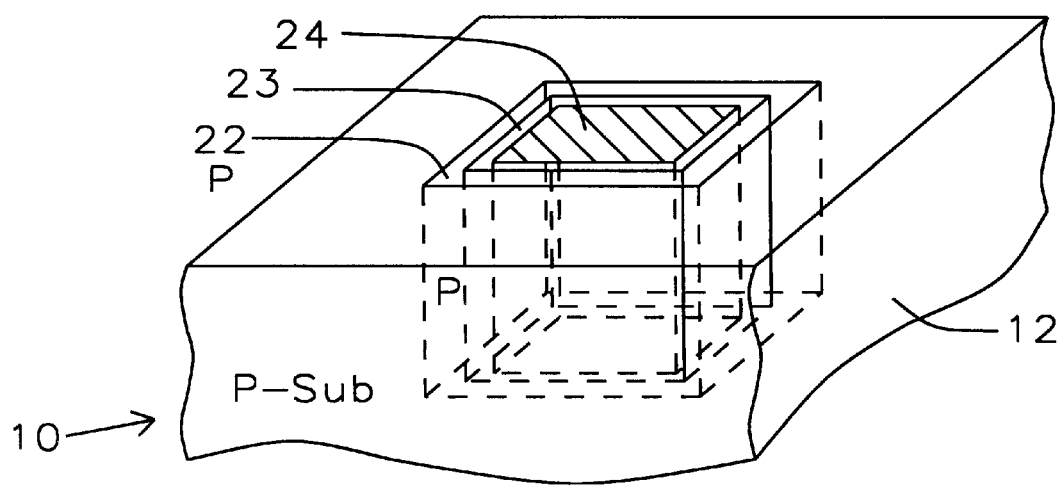
FIG. 6 shows a perspective view of the device of FIG. 5 after the process of depositing a blanket doped floating gate polysilicon layer to filling the trenched site as a floating gate.

FIG. 6 shows a perspective view of the device 10 of FIG. 5 after the process of depositing a blanket doped floating gate polysilicon layer 24 to fill the trenched site as a floating gate. The floating gate was planarized by etching back or by CMP (Chemical Mechanical Polishing) filling the four side cubic trench hole 20 to the top thereof. Thus the floating gate electrode 23 is coplanar with the substrate 12, so the body of the gate electrode is located within the substrate 12 and rises no higher than the surface of the substrate 12, because it was planarized.

FIG. 7 shows a perspective view of the device 10 of FIG. 6 after formation of the N+ doped source/drain regions 27/25 in the substrate 12 self-aligned with the floating gate electrode 24. The source/drain regions 27/25 were doped with N+ type dopant selected from the group consisting of arsenic (As) and phosphorus (P) with a dopant concentration from about 1 E 19 atoms/cm$^3$ to about 1 E 21 atoms/cm$^3$.

Figure 8:
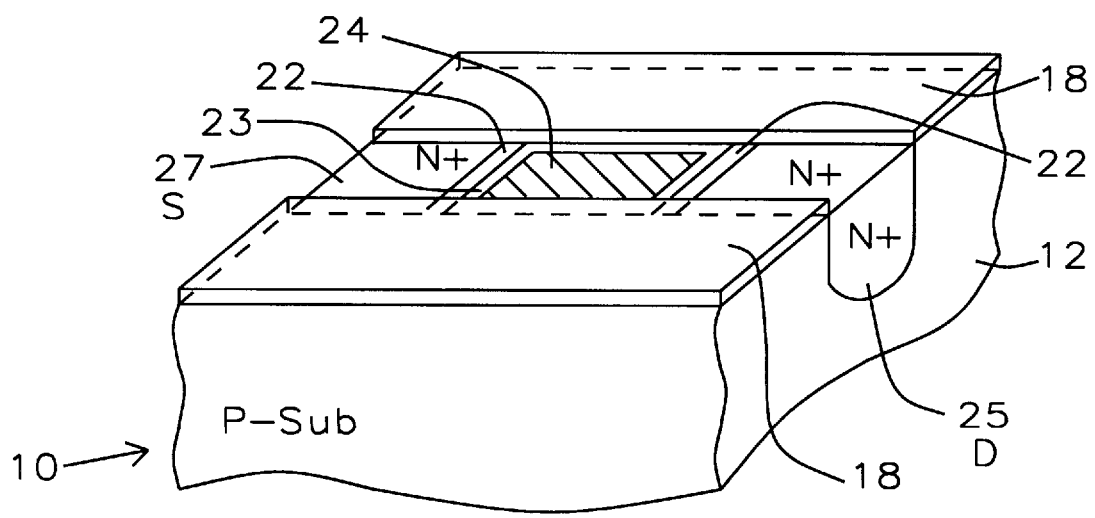
FIG. 8 shows a perspective view of the device of FIG. 7 after formation of an isolation oxide layer formed on either side of the floating gate electrode with a slot over the floating gate electrode and the source drain regions.

FIG. 8 shows a perspective view of the device 10 of FIG. 7 after formation of an isolation (silicon oxide) layer 18 formed on either side of the floating gate electrode 24 with a slot over the floating gate electrode 24 and the source drain regions 27/25.

Figure 9:
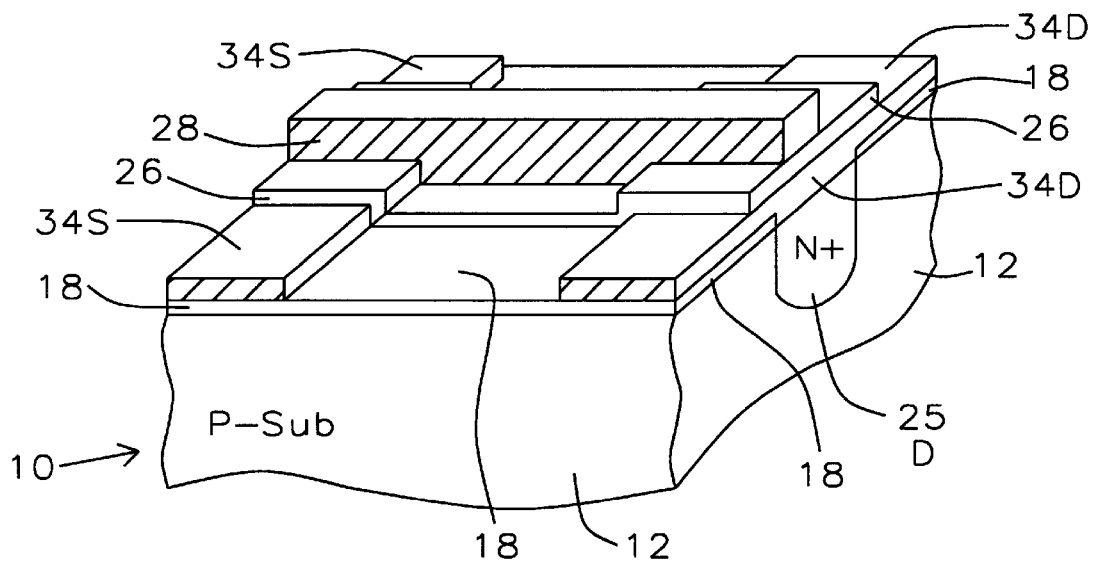
FIG. 9 shows a perspective view of the device of FIG. 8 after formation of a set of source/drain conductor lines extending transversely relative to the slot in the isolation layer reaching down into electrical contact with the source/drain regions respectively on either side of the floating gate electrode.

FIG. 9 shows a perspective view of the device 10 of FIG. 8 after formation of a set of source/drain conductor lines 34S and 34D extending transversely relative to the slot in the isolation layer 18 reaching down into electrical contact with the source/drain regions 27/25 respectively on either side of the floating gate electrode 24.

Figure 10:
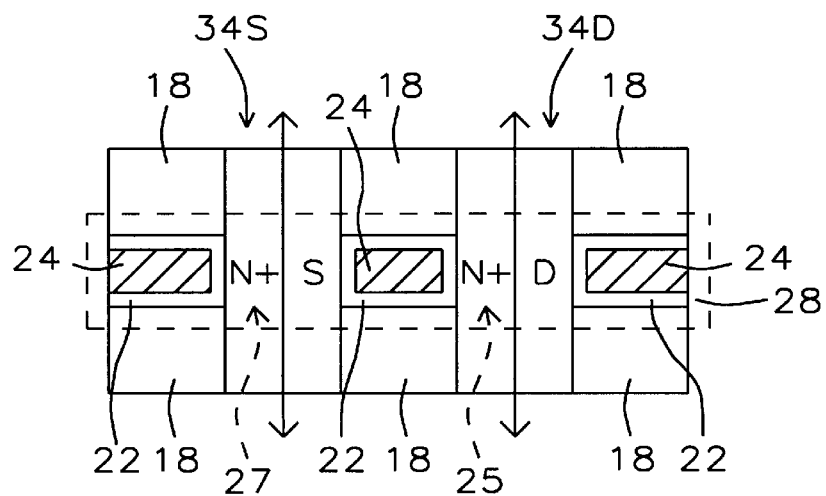
FIG. 10 shows a perspective view of the device of FIG. 9 after formation of an interpolysilicon dielectric layer deposited over the floating gate polysilicon layer and the source/drain conductor lines and the isolation oxide layer.

FIG. 10 shows a perspective view of the device 10 of FIG. 9 after formation of an interpolysilicon dielectric layer 26 deposited over the floating gate polysilicon layer 24 and the source/drain conductor lines 34S and 34D and the isolation (silicon oxide) layer 18.

Figure 11:
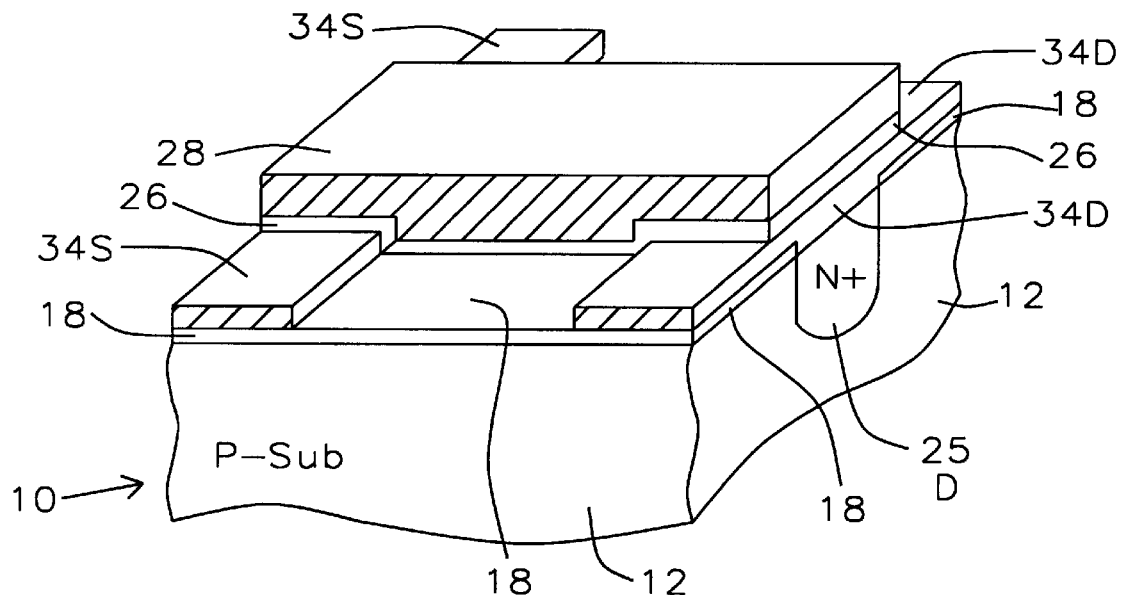
FIG. 11 shows a perspective view of the device of FIG. 10 after formation of a polysilicon/tungsten silicide (WSi) control gate electrode layer has been deposited and patterned on the interpolysilicon dielectric layer as a control gate electrode.

FIG. 11 shows a perspective view of the device 10 of FIG. 10 after formation of a polysilicon/tungsten silicide (WSi) control gate electrode layer 28 has been deposited and patterned on the interpolysilicon dielectric layer 26 as a control gate electrode 28.

Figure 12:
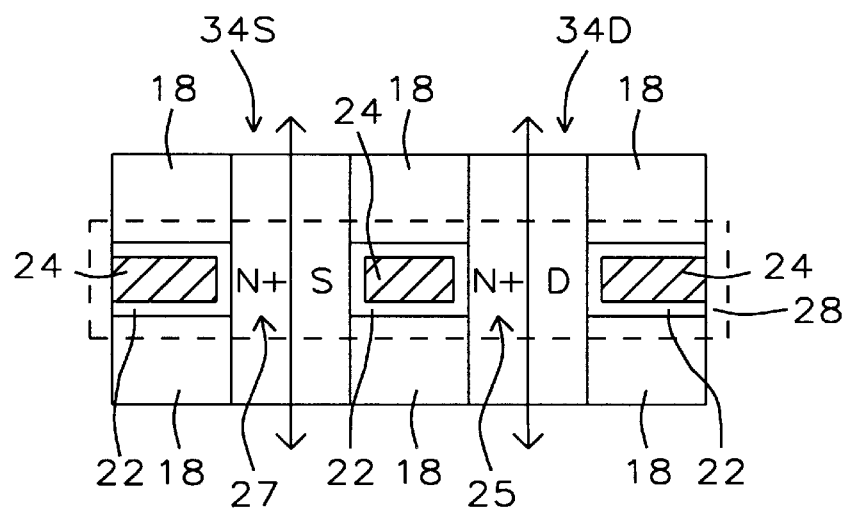
FIG. 12 shows a plan view of the cell structure of a larger fragment of the device of FIG. 11.

FIG. 12 shows a plan view of the cell structure of an larger fragment of device 10. The cell structure as shown includes the control gate electrode/interelectrode dielectric layers 28/26 shown in phantom to reveal the floating gate electrodes 24 and gate oxide layer 22 below. The source/drain conductor lines 34S and 34D are indicated simply by double ended arrows to illustrate their alignment leaving the surfaces of source regions 27 and drain region 28 exposed.

Operation Mode

Figure 13:
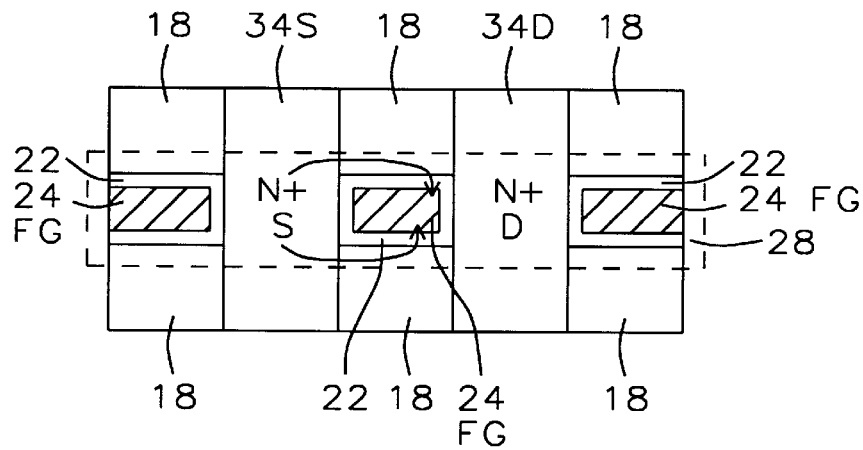
FIGS. 13–15 are schematic plan views of the device based on the shown in FIG. 12 illustrating the programming, the erase mode, and the reading mode of operation of the flash memory device of this invention.
Figure 14:
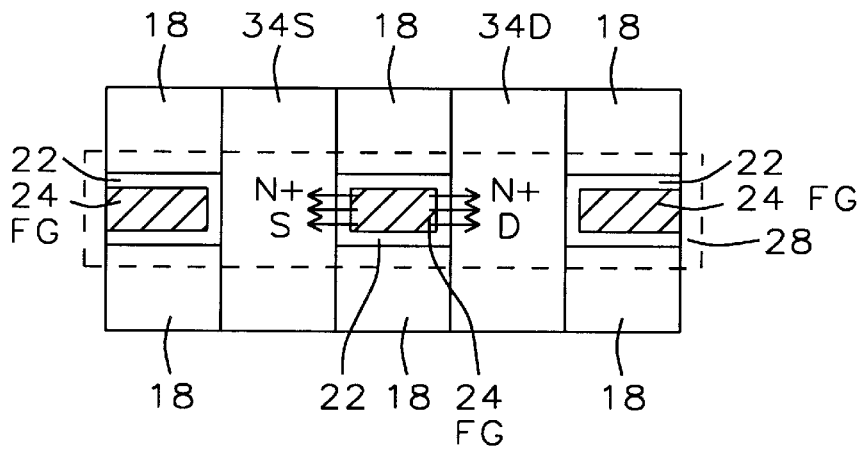
Figure 15:
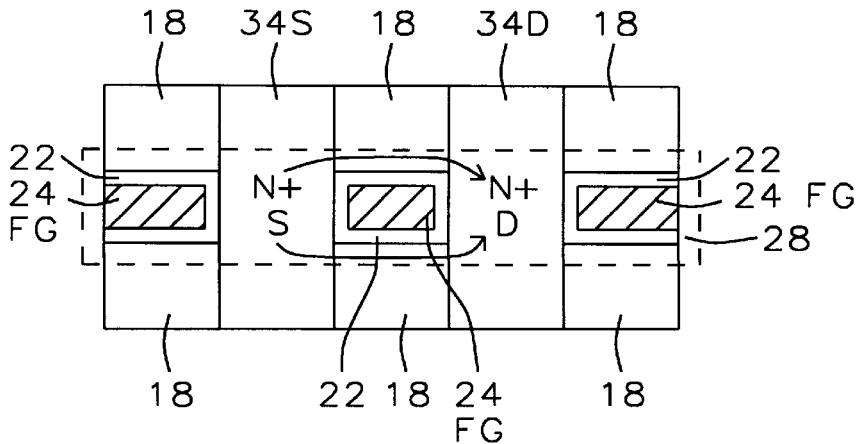

FIGS. 13–15 are schematic plan views of the device 10 (based on the view shown in FIG. 12) illustrating the operation of the flash memory device of this invention.

1. The programming mode is demonstrated in FIG. 13 in which hot electron paths are shown with vertical channel surfaces during programming with voltages as follows:

$V_D = V_{CC}$ $V_{CG} = +V_{high}$ $V_S = V_B = 0)$

FIG. 13 shows hot electron paths on vertical channel surfaces during programming.

2. The erase mode is demonstrated in FIG. 14 in which electron tunneling paths are shown on the source/drain sides during erasing with voltages as follows:

$V_D = V_S = +V_{high}$, e.g. 10V–12V.

$V_{CG} = 0$ $V_B$ is floating

3. The reading mode is demonstrated in FIG. 15. Whether electrons can flow from the source region to the drain region depends on the floating gate (polysilicon 1) electrode 24 is charged or not (programmed or erased). The electron paths for reading are shown in FIG. 15. The voltages are as follows:

$V_D = 1.5V$ $V_{CG} = +V_{CC}$, e.g. 3.5V–5V $V_S = V_B 0$

4. The operation condition of the memory cell is listed in Table I.

TABLE I

Memory Cell Operation Condition

|  |  | Programming | Erase | Read |
|---|---|---|---|---|
| Bit Line | Selected | $V_{CC}$ | $V_{high}$ | $V_{CC}$ |
| (Drain) | Unselected | 0 | 0 | 0 |

TABLE I-continued

Memory Cell Operation Condition

|  |  | Programming | Erase | Read |
|---|---|---|---|---|
| Word Line | Selected | $V_{high}$ | 0 | $V_{CC}$ |
| (Gate) | Unselected | 0 | 0 | 0 |
| Source | Selected | 0 | $V_{high}$ | 0 |
|  | Unselected | 0 | 0 | 0 |
| Buck | Selected | 0 | Floating | 0 |
|  | Unselected | 0 | 0 | 0 |

Second Embodiment

Figure 14A:
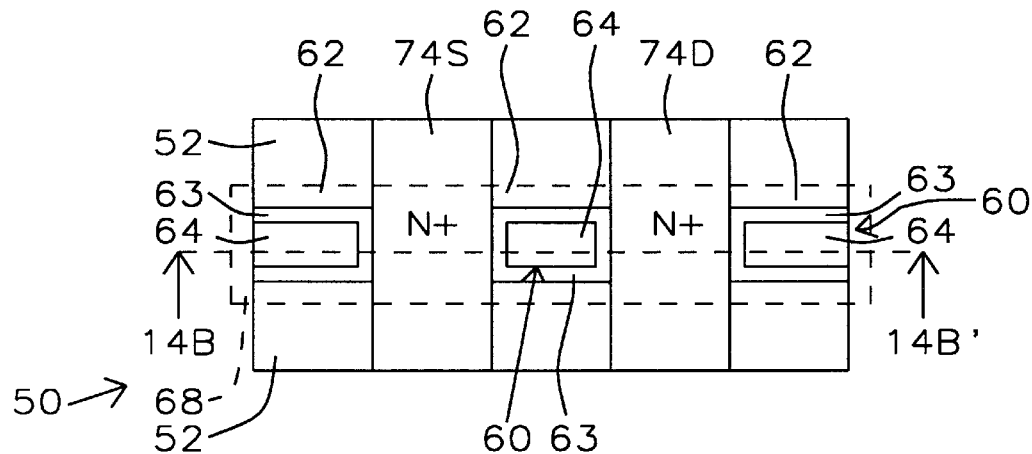
Figure 14B:
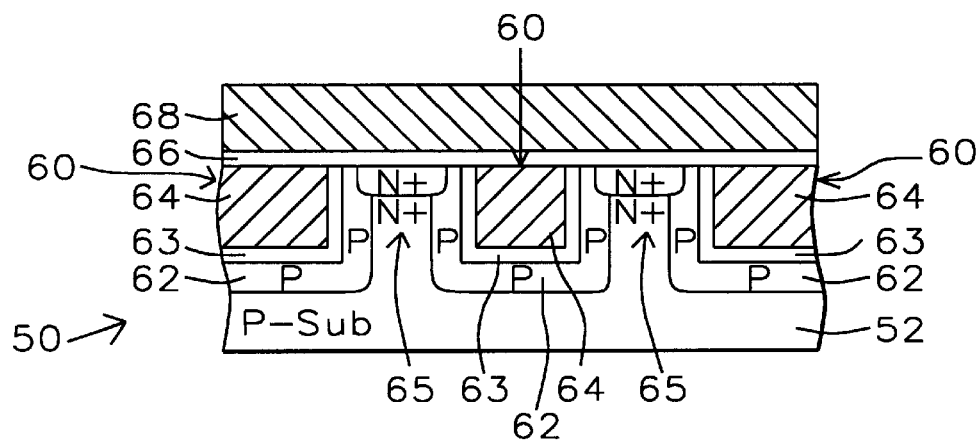

FIGS. 14A shows a plan view of a fragment of an alternative embodiment of this invention exemplified by a device 50 which is shown. FIG. 14B is a sectional view taken along line 14B–14B' of the device 50 of FIG. 14A. The substrate 52 has been etched to form floating gate trenches 60 to a depth from about 1,000 Å to about 20,000 Å. Trenches 60 are aligned in a row. Device 50 was treated by a cell threshold implant of $BF_2$ ions which were applied at a large tilt angle Θ from the horizontal to assure that the silicon 52 in the sidewalls 62 is implanted forming P-doped sidewall regions 62 and P-doped base regions 62 and the bottom surfaces, at the base of trenches 60 to have the right dosage. The threshold implant was preferably formed by ion implanting with a dose of P type boron fluoride ($BF_2$) dopant from about 1 E 13 ions/cm$^2$ to about 1 E 14 ions/cm$^2$, at an energy from about 10 keV to about 50 keV. After annealing, the concentration of boron dopant in the P-doped sidewall and base regions 62 was from about 1 E 14 atoms/cm$^3$ to about 1 E 16 atoms/cm$^3$. The device 50 has N+ S/D source/drain regions 65 formed by ion implantation which was performed with a tilt angle Θ=0 from the vertical to form source/drain regions 65 in substrate 52 between the P doped sidewall regions 62, as well as the trenches 60. The N+ S/D ion implantation was performed by ion implanting with a dose of N type dopant selected from Arsenic (As75) and Phosphorus (P31) from about 1 E 14 ions/cm$^2$ to about 1 E 16 ions/cm$^2$ at an energy from about 20 keV to about 100 keV. After annealing the concentration of arsenic (As)/ phosphorus (P) dopant in the source/drain regions 65 was from about 1 E 19 atoms/cm$^3$ to about 1 E 21 atoms/cm$^3$.

There is a tunnel oxide layer 63 on the exposed surfaces of P doped sidewalls 62 and P doped bottom surfaces 62 in trenches 60. A floating gate polysilicon layer 64 fills the trenches 60. A subtractive processing step such as a polysilicon etch back or CMP (Chemical Mechanical Polishing) step is employed to remove the extra polysilicon above the tunnel oxide layer 63 on the source and drain as well as to planarize the very top surface.

The device 50 has S/D conductor lines 74S and 74D were defined by a S/D diffusion line mask. The device 50 has been doped by ion implanting and diffusion to form the N+ doped source diffusion line 74S and drain diffusion line 74D with a tilt angle of Θ=0 to the vertical. The source line 74S and the drain line 74D are doped to a depth from about 1,000 Å to about 6,000 Å.

The N+ ion implantation to S/D conductor lines 74S and 74D was performed by ion implanting with a dose N type dopant selected from Arsenic (As75) and Phosphorus (P31) from about 1 E 14 ions/cm$^2$ to about 1 E 16 ions/cm$^2$ at an energy from about 20 keV to about 100 keV. After annealing the concentration of arsenic (As)/phosphorus (P) dopant in the source/drain regions 25 was from about 1 E 19 atoms/cm$^3$ to about 1 E 22 atoms/cm$^3$.

FIGS. 10A and 10B show the device 50 after an ONO (Silicon Oxide/silicon nitride/Silicon Oxide) interelectrode dielectric layer 66 was grown in the conventional manner. Later, a polysilicon and tungsten suicide control gate bilayer was formed and patterned with ONO layer 66 into a control gate electrode 68. The ONO layer 66, polysilicon and tungsten silicide bilayer 68 are stacked on step-by-step. The control gate electrode 68 is defined by a control gate mask as shown in FIG. 10A.

After the step of tungsten silicide annealing ends, an ILD (Inter Layer Dielectric) layer is coated on device 50. Then a conventional contact mask is defined for the usual contact holes and the conventional contact ion implanting steps to follow. After tungsten plugs are deposited and etched back, a metal layer is coated and defined by metal layer mask.

Then IMD, VIA and METAL masks are used to complete the back end of the process.

Operation Modes

For channel hot electron programming a schematic plan view of the device 50 of FIG. 10A is shown in FIG. 11 with the hot electron paths are shown on a vertical channel surfaces during programming, where as follows:

$$V_D==V_{CC}$$

$$V_{CG}=V_{high},$$

$$V_S=V_B=0$$

For Fowler-Nordheim tunneling erasing the paths of electrons are shown in FIG. 12. The electron tunneling paths are shown on Source/Drain sides during erasing, where as follows:

$$V_D=V_S=V_{high}$$

$$V_{CG}=0,$$

$$V_S=\text{Floating}$$

The reading process is shown in FIG. 13. The operation conditions of the memory cell are listed in Table I, above. The electron paths from source to drain sides during reading are as follows:

$$V_D=V_{CC}$$

$$V_{CG}=V_{CC}$$

$$V_S=V_B=0$$

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A vertical memory device on a semiconductor substrate having a top surface, said device comprising:

a floating gate trench hole with sidewalls and a bottom formed in said semiconductor substrate, said sidewalls and said bottom of said trench hole having trench surfaces, said sidewalls and said bottom of said floating gate trench hole being doped with a threshold implant through said trench surfaces, a tunnel oxide layer on said trench surfaces, said tunnel oxide layer having outer surfaces, a floating gate electrode formed in said trench hole on said outer surfaces of said tunnel oxide layer, said floating gate electrode being coplanar with said top surface of said substrate, a source region and a drain region formed in said substrate self-aligned with said floating gate electrode and juxtaposed with said sidewalls of said trench hole on opposite sides thereof, a source line and a drain line connecting with said source region and said drain region respectively, an interelectrode dielectric layer formed over the top surface of said floating gate electrode, and a control gate electrode over said interelectrode dielectric layer over the top surface of said floating gate electrode.

2. A memory device in accordance with claim 1 wherein:

the walls of said floating gate trench doped with a threshold implant through said trench surfaces.

3. A memory device in accordance with claim 1 wherein:

said threshold implant comprises boron which was implanted into the walls of said trench hole through said trench surfaces with a concentration of P-type boron dopant from about 1 E 14 atoms/cm$^3$ to about 1 E 16 atoms/cm$^3$.

4. A memory device in accordance with claim 1 wherein:

said interelectrode dielectric layer overlies said source line and said drain line.

5. A memory device in accordance with claim 1 wherein:

said trench hole has a depth from about 1,000 Å to about 20,000 Å.

6. A memory device in accordance with claim 1 wherein:

said floating gate electrode comprises doped polysilicon with a thickness from about 300 Å to about 2,000 Å.

7. A memory device in accordance with claim 1 wherein:

said tunnel oxide layer has a thickness from about 70 Å to about 200 Å, and said floating gate electrode has a thickness of from about 300 Å to about 2,000 Å.

8. A memory device in accordance with claim 1 wherein:

source/drain regions were implanted with a concentration of a dopant selected from the group consisting of arsenic and phosphorus from about 1 E 19 atoms/cm$^3$ to about 1 E 21 atoms/cm$^3$.

9. A memory device in accordance with claim 1 wherein:

said source line region is provided on the source side of said trench hole being aligned with, adjacent to and over said source region, said drain line region is provided on the drain side of said trench hole being aligned with, adjacent to, and over said drain region, and said source line and said drain line are formed on opposite sides of said floating gate electrode.

10. A memory device in accordance with claim 1 wherein:

said source line comprising a source line region provided on the source side of said trench hole being aligned with, adjacent to, and over said source region, said drain line comprising a drain line region provided on the drain side of said trench hole being aligned with, adjacent to, and over said drain region, and said source line region and said drain line region are formed on opposite sides of said floating gate electrode, and said source line region and said drain line region were doped with arsenic dopant with a concentration of from about 1 E 19 atoms/cm$^3$ to about 1 E 21 atoms/cm$^3$.

11. A memory device in accordance with claim 1 wherein:

said tunnel oxide layer has a thickness from about 70 Å to about 200 Å, said floating gate electrode has a thickness of from about 300 Å to about 2,000 Å, and source/drain regions were implanted with a concentration of a dopant selected from the group consisting of arsenic and phosphorus from about 1 E 19 atoms/cm$^3$ to about 1 E 21 atoms/cm$^3$.

12. A vertical memory device comprising:

a floating gate four-sided cubic trench hole with four sidewalls and a bottom formed in a semiconductor substrate having a top surface, said sidewalls and said bottom of said trench hole having trench surfaces, said sidewalls and said bottom of said floating gate trench hole being doped with a threshold implant through said trench surfaces, a tunnel oxide layer formed on said trench surfaces, said tunnel oxide layer having outer surfaces, a floating gate electrode formed in said trench hole on said outer surfaces of said tunnel oxide layer, said floating gate electrode being coplanar with said top surface of said substrate, said floating gate electrode being composed of doped polysilicon, a source region and a drain region formed in said substrate self-aligned with said floating gate electrode and juxtaposed with said sidewalls of said trench hole on opposite sides thereof, a source line and a drain line connecting with said source region and, said drain region respectively, P/N junction isolation means providing a reverse bias of PN junctions in said device, an interelectrode dielectric layer formed over the top surface of said floating gate electrode and said source line region and said drain line region, and a control gate electrode over said interelectrode dielectric layer over the top surface of said floating gate electrode.

13. A memory device in accordance with claim 12 wherein:

said trench hole has a depth from about 100 Å to about 20,000 Å.

14. A memory device in accordance with claim 12 wherein:

said tunnel oxide layer has a thickness from about 70 Å to about 200 Å, and said floating gate electrode has a thickness of from about 100 Å to about 3,000 Å.

15. A memory device in accordance with claim 12 wherein:

said threshold implant comprises boron which was implanted with a concentration of dopant from about 1 E 12 atoms/cm$^3$ to about 1 E 14 atoms/cm$^3$.

16. A memory device in accordance with claim 12 wherein:

source/drain regions were implanted with a dopant selected from the group consisting of arsenic and phosphorus with a concentration of from about 1 E 14 atoms/cm$^3$ to about 1 E 16 atoms/cm$^3$.

17. A memory device in accordance with claim 12 wherein:

said floating gate electrode comprises doped polysilicon with a thickness from about 1,000 Å to about 3,000 Å.

18. A memory device in accordance with claim 12 wherein:

a source line region is provided on the source side of said trench hole being aligned with and adjacent to said source region, a drain line region is provided on the drain side of said trench hole being aligned with and over said drain region, and source/drain regions were implanted with a dopant selected from the group consisting of arsenic and phosphorus with a concentration of from about 1 E 14 atoms/cm$^3$ to about 1 E 16 atoms/cm$^3$.

19. A vertical memory device comprising:

a floating gate four-sided cubic trench hole with four sidewalls and a bottom formed in a semiconductor substrate which has a top surface, said sidewalls and said bottom of said trench hole having trench surfaces, said sidewalls and said bottom of said floating gate trench hole being doped with a threshold implant through said trench surfaces, a tunnel oxide layer on said trench surfaces, said tunnel oxide layer having outer surfaces, a floating gate electrode formed in said trench hole on said outer surfaces of said tunnel oxide layer, said floating gate electrode being coplanar with said top surface of said substrate, said floating gate electrode being composed of doped polysilicon, a source region and a drain region formed in said substrate self-aligned with said floating gate electrode and juxtaposed with said sidewalls of said trench hole on opposite sides thereof, a source line region and a drain line region connecting with said source region and said drain region respectively, said source line region being provided on the source side of said trench and being aligned with and over said source region, said drain line region being provided on the source side of said trench and being aligned with and over said drain region, P/N junction isolation means providing a reverse bias of PN junctions in said device, an interelectrode dielectric layer formed over the top surface of said floating gate electrode, over said source line region and said drain region, and over said top surface of said substrate line region, and a control gate electrode over said interelectrode dielectric layer over the top surface of said floating gate electrode.

20. A memory device in accordance with claim 19 wherein:

said trench hole has a depth from about 100 Å to about 20,000 Å.

21. A memory device in accordance with claim 19 wherein:

said tunnel oxide layer has a thickness from about 70 Å to about 200 Å, and said floating gate electrode has a thickness of from about 100 Å to about 3,000 Å.

22. A memory device in accordance with claim 19 wherein:

said threshold implant comprises boron which was implanted with a concentration of dopant from about 1 E 12 atoms/cm$^3$ to about 1 E 14 atoms/cm$^3$.

23. A memory device in accordance with claim 19 wherein:

source/drain regions were implanted with a dopant selected from the group consisting of arsenic and phosphorus with a concentration of from about 1 E 14 atoms/cm$^3$ to about 1 E 16 atoms/cm$^3$.

24. A memory device in accordance with claim 19 wherein:

said floating gate electrode comprises doped polysilicon with a thickness from about 1000 Å.

25. A memory device in accordance with claim 19 wherein:

source/drain regions were implanted with a dopant selected from the group consisting of arsenic and phosphorus with a concentration of from about 1 E 14 atoms/cm$^3$ to about 1 E 16 atoms/cm$^3$.

* * * * *